PACKAGE FOR SMALL AND DELICATE DEVICES

Filed July 22, 1968 2 Sheets-Sheet 1

INVENTOR.
HAROLD J. NELSON
BY Henry K. Woodward
ATTORNEY

PACKAGE FOR SMALL AND DELICATE DEVICES

Filed July 22, 1968 2 Sheets-Sheet 2

INVENTOR.
HAROLD J. NELSON
BY Henry K. Woodward
ATTORNEY

United States Patent Office 3,524,541
Patented Aug. 18, 1970

3,524,541
PACKAGE FOR SMALL AND DELICATE DEVICES

Harold J. Nelson, Santa Ana, Calif., assignor to Collins Radio Company, Dallas, Tex., a corporation of Iowa Filed July 22, 1968, Ser. No. 746,572
Int. Cl. B65d *81/16, 43/12*
U.S. Cl. 206—65 12 Claims

ABSTRACT OF THE DISCLOSURE

A package for small and delicate devices such as semiconductor chips including a container portion, a cover for the container and a carrier portion for receiving a plurality of container portions for shipping and handling.

This invention relates to packages and in particular to packages for handling, transporting and storing small and delicate objects such as semiconductor chips used in electrical circuit applications, for example.

The advent of the integrated circuit has led to the microminiaturization of electrical circuits as well as providing greatly increased reliability and reduced power consumption of such circuits. An integrated circuit is formed in a small, high purity, single crystalline semiconductor body by complex chemical processing.

Because of the delicate nature of the semiconductor chips or dice, handling and shipping of the chips have presented costly problems. Heretofore, the chips have been individually coated with wax, encapsulated in plastic wrap, and/or sandwiched between polyurethane foam for shipment. Thereafter, each chip has to be cleaned by chemical treatment, and individually sorted and examined before assembly into electrical circuits. Because of the handling between manufacturer and assembler, reject rate of the chips has been running alarmingly high. Moreover, damaged chips are not readily discernible, and ofter defective chips are not discovered until the electrical circuit is assembled and tested.

While these problems have long been recognized, new packaging techniques have offered only limited improvement and have also met with only limited acceptance. Consequently, there is no satisfactory, standard packaging used by semiconductor manufacturers.

Accordingly, an object of this invention is an improved package for handling and shipping semiconductor chips and other small and delicate products.

Another object of the invention is a package which is easily handled and lends itself to mass production of microminiature electrical assemblies.

Still another object of the invention is an improved device package which is economical to produce.

These and other objects and features of the invention will be apparent from the following description and appended claims.

Briefly, the complete device package includes a device container portion, a container cover, and a carrier portion which accommodates a plurality of container portions for shipping and handling. The container portion has in a first portion of a major face thereof, a plurality of depressed regions or cavities with each depressed region suitable for accommodating a semiconductor chip or like product. Two spaced, parallel flange portions on the major face extend above and over portions of the major face, with the flange portions having reverse-angled surface portions. The flange portions define a channel for receiving a cover for the major face with the reverse-angled surface portions engaging the cover and maintaining the cover in close abutment with the major face. The container cover preferably is transparent with optical clarity and is of suitable dimensions for slideably positioning in the channel defined by the flange portions of the container portion. The cover is maintained in the channel portion by a friction fit with the reverse-angled surface portions of the flange portions. The carrier portion for carrying a plurality of device container portions includes at least one channel having a base portion and opposing flange portions extending above and over portions of the base portion. Means are provided on the base portion and flange portions of the channel for engaging the device container portions in a friction fit.

The invention will be more fully understood from the following detailed description and appended claims when taken with the drawing, in which:

Figure 1:
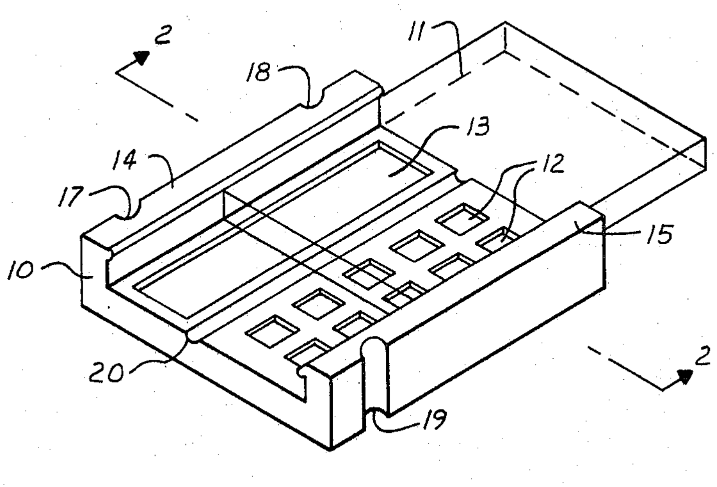
FIG. 1 is a perspective view of a container portion and cover in accordance with the invention.

Referring now to the drawings, FIG. 1 is a perspective view of a container portion 10 and cover 11 in accordance with the invention. A major face of the container portion 10 includes a plurality of depressed regions or cavities 12 which are suitable for accommodating semiconductor chips or the like. Typically, the container may measure approximately 1.0 inch by 1.0 inch by 0.25 inch, and each depressed region may be about 0.1 inch by 0.1 inch by 0.015 inch. Also on the major face is a matted surface 13 on which device numbers, specifications, etc., may be applied. It will be appreciated that the specific layout of the cavities 12 and the matted surface 13 depends largely on customer preference. Spaced, parallel flange portions 14 and 15 on the major face of container 10 define a channel for slideably receiving the cover 11. Side grooves 17, 18 and 19 are provided in opposing sides of container 10 to facilitate handling and positioning of the container during loading of chips into the container or in fabricating electronic assemblies. A centrally located groove 20 extends across the major face of container 10 to facilitate removal of the cover 11 by means of tweezers, wire and the like.

Figure 2:
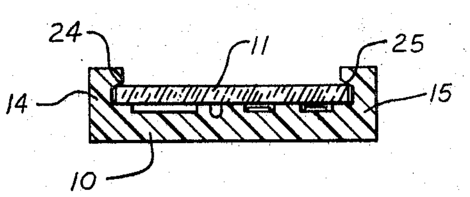
FIG. 2 is a sectional view of the container portion and cover taken along the line 2—2 in FIG. 1.

To insure maximum protection for the semiconductor chips or other devices in the cavities 12, it is most important that the cover 11 fit snugly and securely over the major face of container 10. To provide for this, the flanges 14 and 15 of container 10 are provided with reverse-angled, dove-tailed surfaces for engaging the cover 11. This feature of the container is best seen in FIG. 2 which is a cross-section of the container and cover taken along the line 2—2 in FIG. 1. Referring to FIG. 2, the reverse-angled surfaces 24 and 25 of flanges 14 and 15, respectively, are shown in engagement with upper edges of cover 11 and exerting sufficient pressure on cover 11 to maintain a friction fit of the cover within the channel defined by the flanges 14 and 15 of container 10 and also maintaining the cover snugly against the major face of container 10. Preferably, the edges of cover 11 are square or only slightly rounded to permit greater tolerance of fit with the reverse-angled surfaces 24 and 25.

Figure 4:
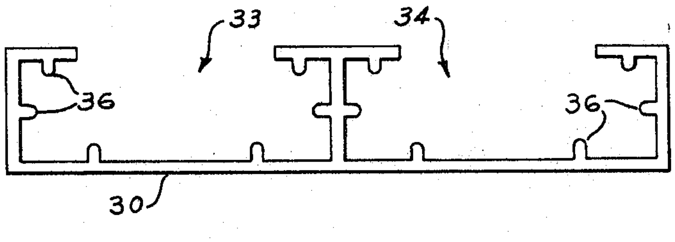
FIG. 4 is an end view of the carrier portion of FIG. 3.
Figure 3:
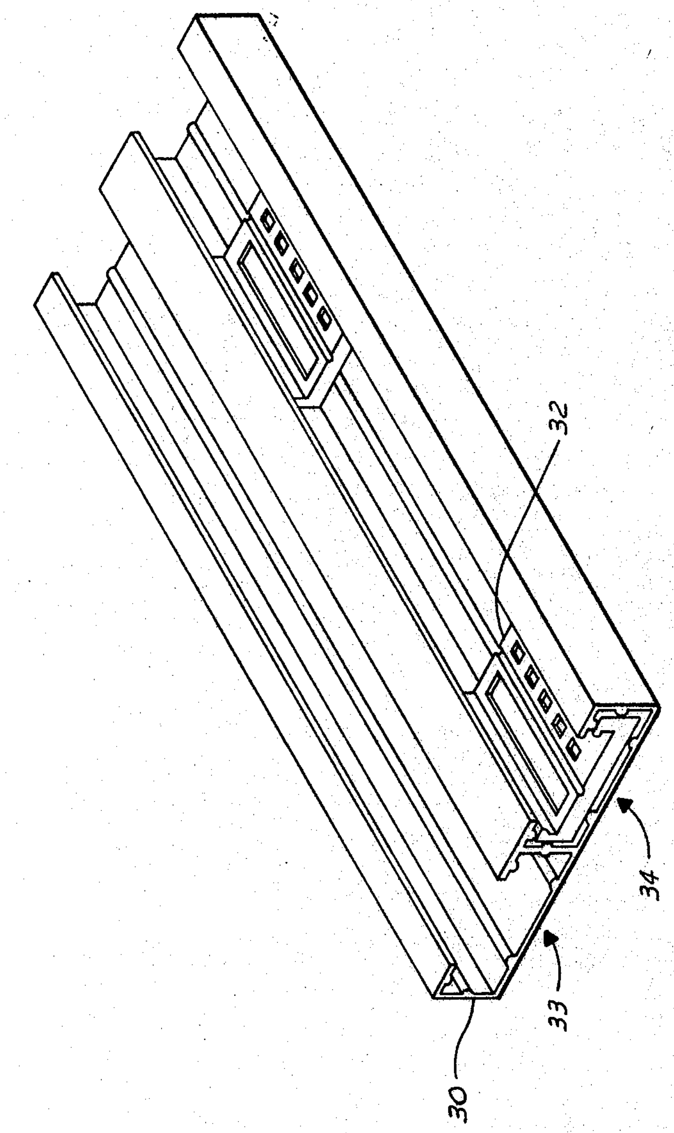
FIG. 3 is a perspective view of a carrier portion in accordance with the invention carrying a plurality of container portions.

The complete package is shown in perspective in FIG. 3 where a carrier portion 30 for shipping and storing the loaded containers is shown partially filled with containers 32. Carrier 30 includes two channel portions shown generally at 33 and 34 with each channel having a base portion and opposing flange portions extending above and over portions of the base portion. Referring to the end view of the carrier shown in FIG. 4, it will be noted that the base portions and flange portions of channels 33 and 34 are provided with a plurality of ribs 36 running the length of the channels which slideably receive the device containers 32. Thus, each channel can easily receive or discharge device containers by serially sliding the containers into or out of the channel. The packages are not only easy to load and unload, they also provide increased protection for the semiconductor chips during shipment and storage which has considerably decreased device reject rate. Further, semiconductor chips can be visibly inspected while in the container and carrier without the necessity for handling the individual chips. Thus, contamination of the chip is reduced.

The described device package is economical as the container portion and cover can be injection molded and the carrier portion extruded. The channel of the container portion may be machine beveled or molded to provide the dove-tailed surfaces. While the specific material for the package is determined primarily on customer preferences, specific embodiments of the container portion have been made with a high density polyethylene such as Du Pont Alathon 7040 and the cover is preferably a clear acrylic resin such as Du Pont Lucite 140. A methyl methacrylate polymer such as American Cyanamide XT polymer 250 has been used for the extruded carrier portion.

While the invention has been described with reference to specific embodiments, the description is illustrative and not to be construed as limiting the scope of the invention. Various modifications and changes may occur to those skilled in the art without departing from the spirit and scope of the invention.

What is claimed is:

1. A package for semiconductor chips and other small and delicate products comprising (a) A container portion having in a first portion of a major face thereof a plurality of depressed regions, each of said depressed regions suitable for accommodating a product, two spaced, parallel flange portions on said major face, said flange portions extending above and over portions of said major face, said flange portions having reverse-angled surface portions, said flange portions defining a channel for slideably receiving a cover for said major face with said reverse-angled surface portions engaging the cover and maintaining the cover in close abutment with said major face, (b) A cover for said container portion of suitable dimensions for slideably positioning in said channel defined by said flange portions of said container portion with said reverse-angled surface portions engaging said cover and maintaining said cover in close abutment with said major face, and (c) A carrier portion for receiving a plurality of container portions, said carrier portion having at least one channel including a base portion and opposing flange portions extending above and over portions of said base portion, said channel being of suitable dimensions for slideably receiving said container portions.

2. A package for semiconductor chips and other small and delicate products as defined by claim 1 wherein said container portion has a plurality of side grooves to facilitate handling and positioning of said container.

3. A package for semiconductor chips and other small and delicate products as defined by claim 1 wherein said container portion includes a centrally located groove extending across said major face to facilitate removal of said cover.

4. A package for semiconductor chips and other small and delicate products as defined by claim 1 wherein the edges of said cover are substantially square.

5. A package for semiconductor chips and other small and delicate products as defined by claim 1 wherein said cover is transparent.

6. A package for semiconductor chips and other small and delicate products as defined by claim 1 wherein said base portion and said opposing flange portions of said at least one channel of said carrier portion include a plurality of ribs running the length of said channel.

7. A package for semiconductor chips and other small and delicate products as defined by claim 6 wherein said carrier portion includes a plurality of channels.

8. A package for semiconductor chips and other small and delicate products as defined by claim 1 wherein said container portion and said cover are of injection molded plastic and said carrier portion is of extruded plastic.

9. In a package for semiconductor chips, an injection moldable chip container portion including in a first portion of a major face thereof a plurality of shallow cavities, each of said cavities being suitable for accommodating a chip, two spaced, parallel flange portions on said major face, said flange portions extending above said major face and over portions of said major face, said flange portions having dove-tailed surface portions, said dove-tailed surface portions defining a channel for receiving in friction fit a cover for said major face with said dove-tailed surface portions engaging the cover and maintaining the cover in close abutment with said major face, said cover being receivable from either end of said channel.

10. A device container portion as defined by claim 9 and further including side grooves in opposing sides to facilitate handling and positioning of said container.

11. A device container portion as defined by claim 10 and further including a centrally located groove extending across said major face of said container to facilitate removal of the cover.

12. A semiconductor chip package comprising an injection moldable chip container part including a plurality of shallow cavities in a major face thereof for accommodating chips in relatively close tolerance, two spaced parallel flange portions on said major face extending above said major face and over portions of said major face, reverse-angled surface portions on either of said flange portions defining a channel for firmly receiving in friction fit a cover from either end of said channel and maintaining the cover in close abutment with said major face, and a cover of suitable dimensions for slideably inserting into said channel as described.

References Cited

UNITED STATES PATENTS

| | | | |
|---|---|---|---|
| 623,594 | 4/1899 | Burt. | |
| 2,292,279 | 8/1942 | Marton | 206—1 |
| 2,792,934 | 5/1957 | Rocchetti | 206—17 |
| 3,144,126 | 8/1964 | James | 206—45.34 |
| 3,184,071 | 5/1965 | Delaire | 220—41 |
| 3,168,193 | 2/1965 | Schechter | 220—23.4 |
| 3,280,969 | 10/1966 | Evans et al. | |
| 3,406,821 | 10/1968 | Weissberg | 220—41 |
| 3,409,861 | 11/1968 | Barnes et al. | |

WILLIAM T. DIXSON, Jr., Primary Eraminer

U.S. Cl. X.R.

206—1; 220—41